United States Patent [19]

Brower

[11] 4,427,369
[45] Jan. 24, 1984

[54] SWITCH PASTE WITH SILVER-COATED METAL BEADS

[75] Inventor: Boyd G. Brower, Williamsport, Pa.

[73] Assignee: GTE Products Corporation, Stamford, Conn.

[21] Appl. No.: 380,202

[22] Filed: May 20, 1982

[51] Int. Cl.³ ............................................. F21K 5/02
[52] U.S. Cl. .................................. 431/359; 252/513; 252/514; 362/6; 362/13
[58] Field of Search ................. 431/359; 362/4, 6, 11, 362/13; 252/513, 514

[56] References Cited

U.S. PATENT DOCUMENTS

| | | | |
|---|---|---|---|
| 4,080,155 | 3/1978 | Sterling | 431/359 |
| 4,234,304 | 11/1980 | Heytmeijer | 431/359 |
| 4,320,440 | 3/1982 | Brower et al. | 431/359 |
| 4,330,821 | 5/1982 | Brower et al. | 431/359 |
| 4,336,570 | 6/1982 | Brower et al. | 431/359 |

*Primary Examiner*—Carroll B. Dority, Jr.
*Attorney, Agent, or Firm*—Thomas H. Buffton

[57] ABSTRACT

A photoflash unit in the form of a multilamp photoflash array has at least one normally open (N/O) radiation-responsive switch which includes an admixture containing silver-coated metal particles.

15 Claims, 2 Drawing Figures

SWITCH PASTE WITH SILVER-COATED METAL BEADS

TECHNICAL FIELD

This invention relates to multilamp photoflash arrays which include at least one normally-open (N/O) radiation-responsive switch and more particularly to multilamp photoflash arrays which include radiation-responsive switches having silver-coated metal particles therein.

BACKGROUND ART

The prior art includes numerous multilamp photoflash arrays having a multitude of flashlamp sequencing arrangements. For example, series and parallel-connected lamp arrays, electrical and mechanical firing and switching configurations and relatively high and low voltage-responsive switches and photoflash lamps are known in the art. The switches also involve a number of distinct categories dependent upon the response to radiant energy such as melting, fusing or chemically reacting.

As the art progressed, the photoflash arrays have become smaller and more compact in order to reduce the cost and increase the efficiency. However, this miniaturization is not without problems, and one of the more evident problems is an increase in radiant energy applied to adjacent switches and, in turn, a tendency for an increased failure rate of the switches due to a condition known as "blow-off." As is known, the blow-off or burned off condition of the switching material occurs during conversion of the switch from a high to low resistance condition as the result of radiation from a nearby flashlamp. Moreover, it is also known that humidity has a deleterious effect upon radiation-responsive switches normally utilized in sequentially operated multilamp photoflash arrays.

Attempts to eliminate or at least reduce the above-mentioned problems have been and still are being provided. For example, U.S. Pat. No. 3,990,833 of Holub et al. suggests the addition of a humidity resistant organic polymer binder to the switch compostion to reduce humidity problems. Also, U.S. Pat. No. 4,087,233 of Shaffer provides for the addition of an oxidizer such as barium chromate which is particularly resistant to high relative humidity. Moreover, U.S. Pat. No. 3,969,066 of Smialek et al. adds cupric oxide to a switching composition along with a humidity resistant organic polymer binder.

Additionally, a blow-off reduction technique is provided in U.S. Pat. Nos. 4,156,269 and 4,164,007 wherein about 10% by weight of glass beads is added to the switching composition. This improvement was followed by a copending application bearing Ser. No. 21,398 filed Mar. 19, 1979, now U.S. Pat. No. 4,320,440, wherein inert filler particles such as titanium dioxide are included in the switch material composition.

However, the above-mentioned patents and applications are particularly addressed to high voltage arrays wherein a pulse voltage in the range of several thousand volts is employed to convert the switch from a relatively high to a relatively low resistance value. On the other hand, it can readily be understood that switches responsive to relatively low voltages, 10 to 20 volts for example, present other problems when conversion to a low resistance value is desired.

One suggestion for promoting good mechanical integrity and preventing "burn-off" in a low voltage switch is set forth in U.S. application bearing Ser. No. 253,358 filed Apr. 13, 1981, now U.S. Pat. No. 4,327,976, in the name of Shaffer et al. Therein, a powdered metal in stoichiometric excess is added to the switch composition and enhances the conductivity upon activation of the array from a low voltage source. Also, improved resitance to humidity is provided in an application bearing Ser. No. 148,358 filed in the name of Brower et al. on June 9, 1980, now U.S. Pat. No. 4,330,821. Therein, silver-coated glass beads are included in the switch material composition and serve to enhance the resistance of the composition to undesired humid conditions.

Although the above-described switch material utilizing silver-coated glass beads has provided excellent results in numerous applications and particularly in applications utilizing a relatively low voltage source, it has been found that there are other arrays and applications wherein such structures leave something to be desired. More specifically, it has been found that enhanced conductivity and resistance to humidity are desirable in switches responsive to a low voltage energizing potential.

OBJECTS AND SUMMARY OF THE INVENTION

An object of the present invention is to provide an enhanced sequentially operable multilamp photoflash array. Another object of the invention is to improve the switching capability of a multilamp photoflash array. Still another object of the invention is to provide a radiation-responsive switch for a photoflash array having an enhanced resistance to humidity and improved conductivity. A further object of the invention is to provide a multilamp photoflash array having normally-open switches responsive to radiation from a flashlamp energized from a low voltage source and having improved electrical conductivity.

These and other objects, advantages and capabilities are achieved in one aspect of the invention by a multilamp photoflash array having at least one radiation-responsive switch which includes an admixture having silver-coated metal particles therein along with a binder and silver oxide or silver carbonate materials.

BEST MODE FOR CARRYING OUT THE INVENTION

For a better understanding of the present invention, together with other and further objects, advantages and capabilities thereof, reference is made to the following disclosue and appended claims in conjunction with the accompanying drawings.

Figure 1:
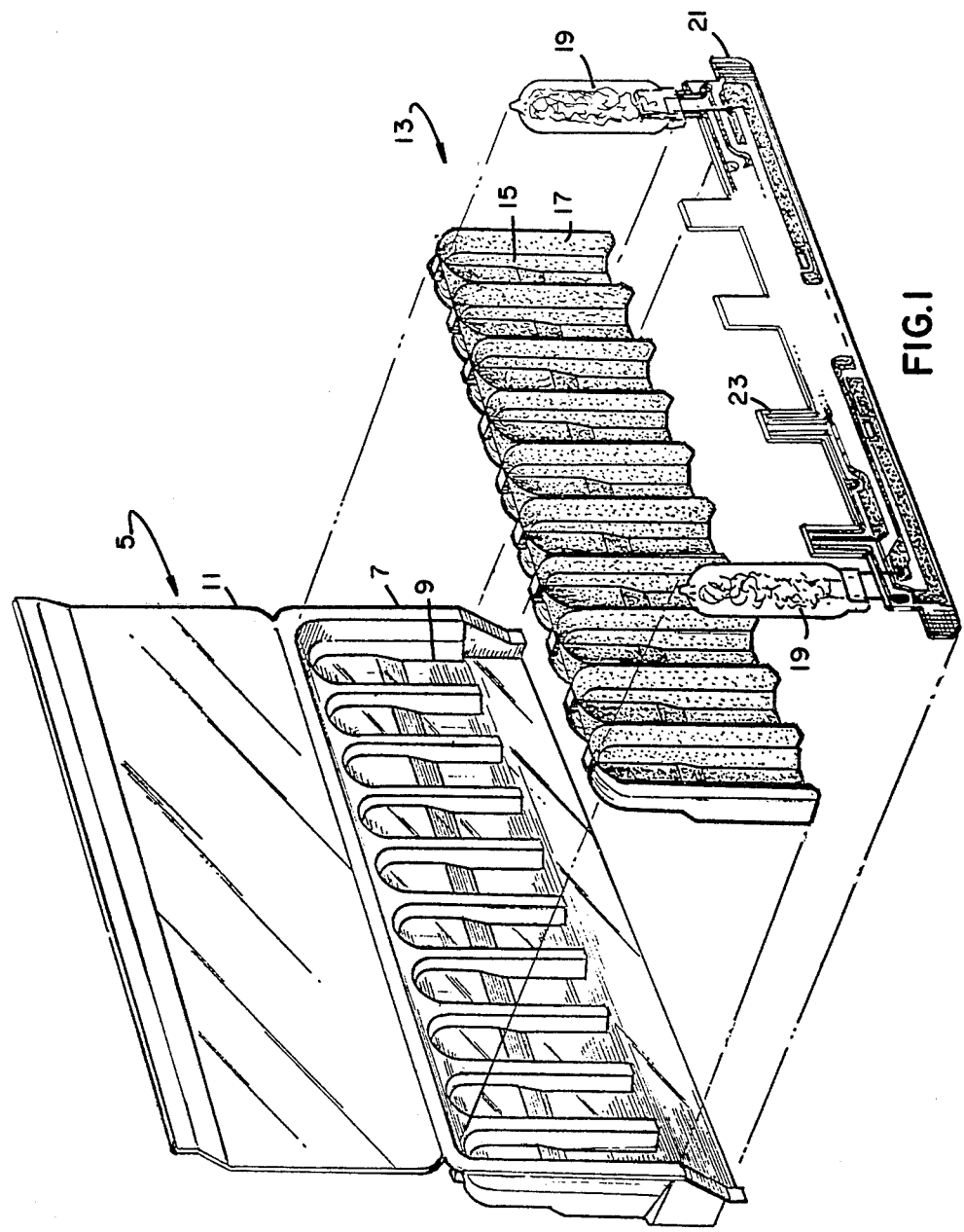
FIG. 1 is an exploded view of a preferred form of self-sequencing multilamp photoflash array utilizing a radiant-responsive switch.

Referring to the drawings, FIG. 1 illustrates a self-sequencing multilamp photoflash array. The array includes a plastic envelope 5 having a back portion 7 with a plurality of lamp-recieving cavities 9. Also, a light transmittable front portion 11 is foldably affixed to the back portion 7 and formed for enclosure of the lamp-receiving cavities 9. A reflector unit 13 includes a plurality of reflector cavities 15 each having a reflective surface 17 and formed to nest in the lamp-receiving cavities 9 of the back portion 7 of the envelope 5. Each of the reflector cavities 15 is formed to receive a flashlamp 19 which is positioned immediately adjacent a reflective surface 17.

Figure 2:
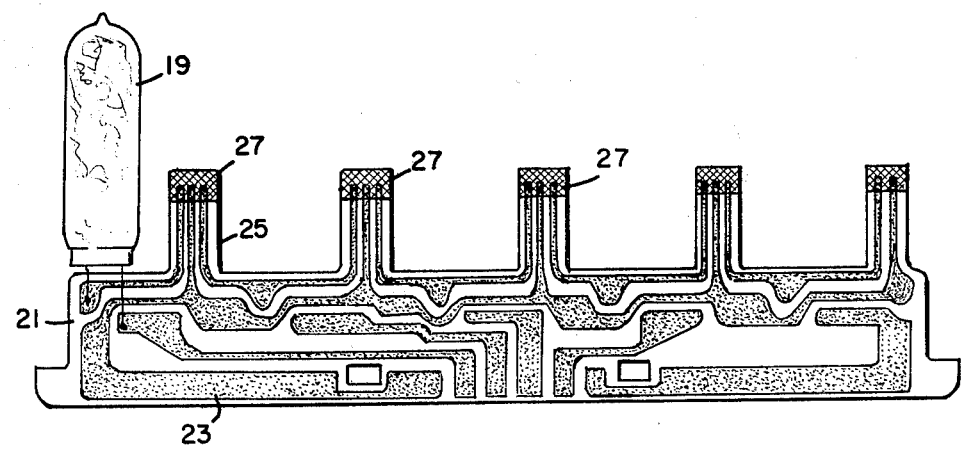
FIG. 2 is a printed circuit board illustrating a suitable arrangement for radiation-responsive switches of the array of FIG. 1.

As can be more clearly seen in the illustration of FIG. 2, each of the flashlamps 19 is affixed to a circuit board 21 having a printed circuit of electrically conductive material 23 thereon. Preferably, the printed circuit 23 is formed by and affixed to the circuit board 21 by a die-stamping technique such as described in U.S. Pat. No. 3,990,142 of Weglin. Also, the circuit board 21 includes a plurality of finger-like portions 25 which are formed for placement within the reflector cavities 15 of the reflector unit 13. Disposed on each one of these finger-like portions 25 of the circuit board 21 is a normally-open (N/O) radiation-responsive switch 27.

As to the radiation-responsive switches 27, it has been mentioned that the above-mentioned switches 27 are preferably employed in an array utilizing a low voltage source. Thus, complete conversion of the switches 27 from a non-conductive to a conductive state is essential if an undesired high resistive value is to be avoided. Moreover, the nearness of the flashlamps 19 to the switches 27 in a miniaturized array, as illustrated in FIG. 1, renders a complete conversion without "blow-off" of the switches 27 essential.

In overcoming the above-mentioned obstacles, it has been found that a radiation-responsive switch 27 fabricated from an admixture which includs either silver oxide or silver carbonate, an organic binder and silver-coated metal particles provides enhanced resistance to humidity as well as increased resistance to undesired "blow-off." Preferably, the binder is one which absorbs relatively little water and tends to minimize gas generation. Thus, polystyrene is a preferred organic binder although other binders such as epoxy, arcylics, polyvinyl butyral and polyvinyl formel are suitable substitutes. Moreover, the binder may vary in the range of about 1 to 20% by weight and a preferred admixture included about 7.0% by weight of polystyrene.

As to the silver-coated metal particles, a preferred material is a metal selected from the group consisting of copper, nickel and stainless steel. The metal particles are coated with silver in the amount of about 6% by weight, although quantities in the range of about 4 to 12% by weight have been employed. Ordinarily, the admixture includes silver-coated metal particles in the range of about 5 to 70% by weight along with the above-mentioned binder in the range of about 1 to 20% by weight and silver carbonate and/or silver oxide in the range of about 5 to 70% by weight. In one specific embodiment, the admixture includes by weight about 34% silver carbonate, 7% binder and 59% copper particles having a 6% silver coating thereon.

Further, it should be noted that the above-mentioned metal particles are of a size of 200 mesh or finer and tend to provide not only enhanced electrical conductivity but also improved heat transfer and resistance to humidity. As a result switches made with the above-mentioned admixture having silver-coated copper particles therein tended to provide a resistance after conversion about 27% lower than switches employing an admixture of silver-coated glass beads. Moreover, the above switch configuration having a lower resistance value is especially desirable when employed in arrays responsive to a low voltage source wherein conductivity through the converted switches is important to the proper operation of the array. Moreover, it has been found that the enhanced conductivity of the switches, due to the presence of the metal particles, greatly improves the conversion of the switch and more than compensates for any heat-sinking effects caused by the circuit runs and especially relatively solid circuit runs provided by die-stamping techniques.

While there has been shown and described what is at present considered the preferred embodiments of the invention, it will be obvious to those skilled in the art that various changes and modifications may be made therein without departing from the invention as defined by the appended claims.

I claim:

1. A multilamp photoflash array having at least one radiation-responsive switch including an admixture of silver oxide and/or silver carbonate, a binder material and characterized by the improvement wherein said admixture includes silver-coated metal particles.

2. The multilamp photoflash array of claim 1 wherein said binder material of said admixture is in the form of polystyrene.

3. The multilamp photoflash array of claim 1 wherein said silver-coated metal particles of said admixture are selected from the group consisting of copper, nickel and stainless steel.

4. The multilamp photoflash array of claim 1 wherein said silver-coated metal particles of said admixture are in the form of copper particles having a silver coating of about 6% by weight.

5. The multilamp photoflash array of claim 1 wherien said silver-coated metal particles of said admixture are in the range of about 5 to 70% by weight.

6. The multilamp photoflash array of claim 1 wherein said admixture includes silver carbonate and/or oxide in the range of about 25 to 70% by weight, silver-coated metal beads in the range of about 5 to 70% by weight and binder in the range of about 1 to 20% by weight.

7. The multilamp photoflash array of claim 1 wherein said silver-coated metal particles are in the form of silver-coated nickel particles.

8. The multilamp photoflash array of claim 1 wherein said silver-coated metal particles are in the form of silver-coated stainless steel particles.

9. The multilamp photoflash array of claim 1 wherein said admixture includes about 34% silver carbonate, about 59% silver-coated copper beads and about 7% polystyrene by weight.

10. The multilamp photoflash array of claim 1 wherein said metal particles of said admixture are of a size not greater than about 200 mesh.

11. A radiation-responsive switch for a multilamp photoflash array comprising an admixture of silver carbonate and/or silver oxide, a binder material and characterized by the improvement wherein said admixture includes silver-coated metal particles in the amount of about 5 to 70% by weight.

12. The radiation-responsive switch of claim 11 wherein said admixture includes silver-coated metal particles selected from the group consisting of copper, nickel and stainless steel.

13. The radiation-responsive switch of claim 11 wherein said admixture includes silver-coated copper particles having a silver coating of about 6% by weight.

14. The radiation-responsive switch of claim 11 wherein said admixture includes about 25 to 70% by weight of silver carbonate and/or silver oxide, about 5 to 70% by weight of silver-coated metal particles and about 1 to 20% by weight of binders.

15. The radiation-responsive switch of claim 11 wherein said admixtue includes about 34% silver carbonate, 7% polystrene and about 34% silver carbonate, 7% polystyrene and about 59% silver-coated metal particles selected from the group consisting of copper, nickel and stainless steel.

* * * * *